United States Patent [19]

Kurth

[11] 4,019,924
[45] Apr. 26, 1977

[54] SOLAR CELL MOUNTING AND INTERCONNECTING ASSEMBLY

[75] Inventor: William T. Kurth, Wenham, Mass.

[73] Assignee: Mobil Tyco Solar Energy Corporation, Waltham, Mass.

[22] Filed: Nov. 14, 1975

[21] Appl. No.: 631,817

[52] U.S. Cl. .............................................. 136/89 P
[51] Int. Cl.² ........................................ H01L 31/04
[58] Field of Search .............. 136/89; 244/1 R, 173

[56] References Cited

UNITED STATES PATENTS

| | | | |
|---|---|---|---|
| 3,454,774 | 7/1969 | Wizenick | 250/220 |
| 3,466,198 | 9/1969 | Webb | 136/89 |
| 3,553,030 | 1/1971 | Lebrun | 136/89 |
| 3,562,020 | 2/1971 | Blevins | 136/89 |
| 3,713,893 | 1/1973 | Shirland | 136/89 |
| 3,849,880 | 11/1974 | Haynos | 29/626 |

*Primary Examiner*—R. L. Andrews
*Assistant Examiner*—Aaron Weisstuch
*Attorney, Agent, or Firm*—Schiller & Pandiscio

[57] ABSTRACT

A solar cell assembly comprises a plurality of solar cells mounted on a laminate comprising a base electrically-insulative sheet, an electrically-conductive layer disposed on the base sheet in a predetermined pattern so as to provide first and second cell-connecting sections electrically insulated from one another, and a second electrically-insulative sheet having a plurality of openings and being disposed over the conductive layer so that selected portions of the conductive layer are exposed through the openings. The laminate is provided with a plurality of bent tabs, each of which includes an exposed portion of the first cell-connecting section so that the exposed portion can be attached to the top surface electrode of a solar cell. At least one exposed portion of a second cell-connecting section of the conductive layer is attached to the bottom surface electrode of the same cell. Various circuit patterns of the electrically-conductive layer are described for connecting the cells in a series or parallel array and for use in width-limited systems, such as solar concentrators.

15 Claims, 8 Drawing Figures

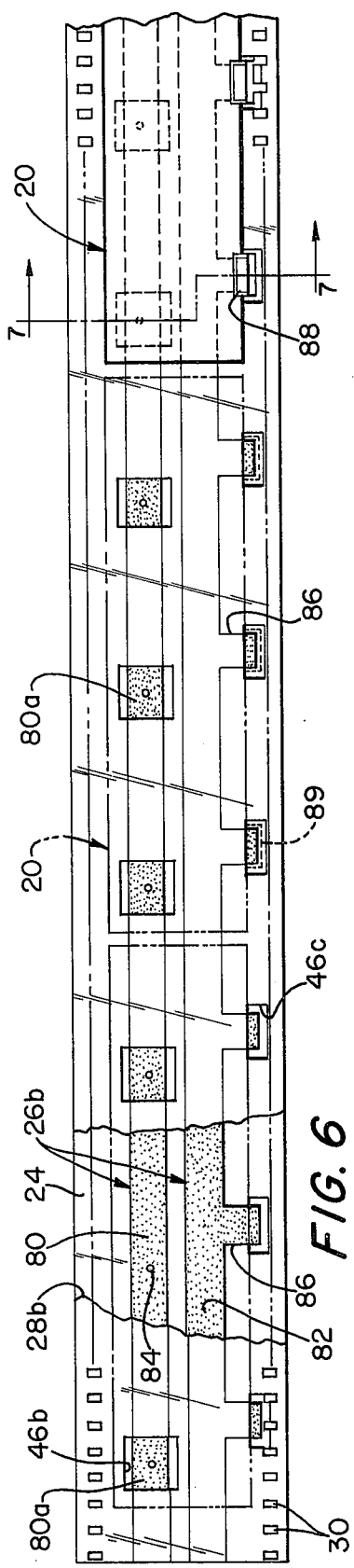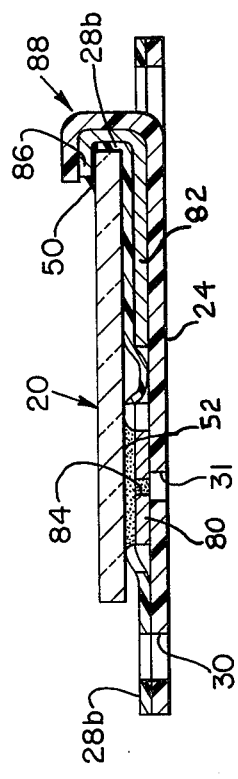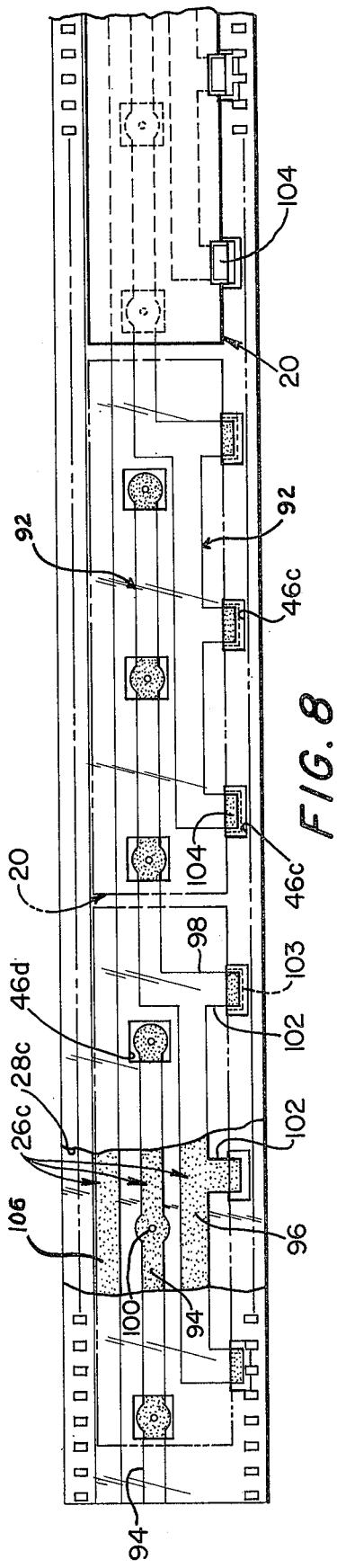

SOLAR CELL MOUNTING AND INTERCONNECTING ASSEMBLY

This invention relates to solar cell assemblies and in particular to a light-weight assembly which provides mechanical and electrical interconnection of individual solar cells.

With the advent of space exploration as well as the crises arising from the shortages of fossil fuels, solar cells have gained considerable importance as a source of power. Generally, in order to meet power requirements, the cells are supported so that they can be electrically interconnected in a series and/or parallel array to form solar cell assemblies. The arrays may be flexibly supported, such as shown in U.S. Pats. Nos. 3,553,030 and 3,819,417, or rigidly supported, such as shown in U.S. Pat. No. 3,457,427.

The present invention is directed to a flexible solar cell assembly which is an improvement over known flexible assemblies such as the one disclosed in U.S. Pat. No. 3,553,030. The latter patent describes a solar cell assembly in which one side of a plastic sheet is provided with a plurality of separate metallic zones to form a flexible support. The support is cut so that "tags" are formed along peripheral portions of the metal zones. The "tags" are folded so that portions of the metal zones can be soldered to both sides of the solar cells. The exposed metal zones, however, are subject to oxidation and corrosion. Further, since the zones are exposed, short-circuiting between various zones can easily occur. Additionally, the dimensions of the patented assembly make the assembly difficult to use in "width-limited" systems, such as solar concentrators and the like.

It is the primary object of the present invention to overcome the aforementioned problems of the prior art.

Another object of the present invention is to provide an improved solar cell supporting and interconnecting assembly which substantially reduces the chances of oxidation and corrosion of the interconnecting structure as well as short-circuiting of the individual solar cells from occurring.

Still another object of the present invention is to provide an improved solar cell supporting and interconnecting assembly which is of sufficient flexibility so that it can be shaped to match curved profiles or small radii of mounting structures to which the supporting and interconnecting assembly can be attached.

Yet another object of the present invention is to provide an improved solar cell assembly having a relatively greater resistance against thermal shocks and vibrations than provided by some of the prior art assemblies.

And still another object of the present invention is to provide a light weight solar cell assembly having an interconnecting structure which maintains good electrical contact between solar cells of the same or other assemblies to form series and/or parallel matrices.

And yet another object of the present invention is to provide a solar cell assembly which is easily adapted to be used in width-limited systems, such as solar concentrators.

And still other objects of the present invention are to provide a solar cell mounting and interconnecting assembly which is relatively inexpensive to manufacture, has a rugged construction and can be produced in modular form.

These and other objects of the present invention are achieved by a solar cell mounting and interconnecting assembly which is particularly adapted to be used with flat solar cells of the type having top and bottom surface electrodes. The mounting and interconnecting structure comprises a laminate including a first sheet of electrically-insulative material, a layer of electrically-conductive material disposed on the first sheet in a predetermined pattern so as to form first and second cell-connecting or terminal sections, and a second sheet of electrically-insulative material disposed on the layer and secured to portions of the first sheet. The second sheet is provided with a plurality of openings which are disposed relative to he conductive layer so as to expose at least one terminal portion of the layer through each opening. Selected portions of the laminate are cut so as to provide bendable tabs, each of which includes at least one of the first cell-connecting or terminal sections. The cells are disposed on the laminate and are electrically connected by attaching the conductive layer of at least one tab to the top surface electrode of each cell and attaching at least one of the second cell-connecting or terminal sections to the bottom surface electrode of each cell. Laminates with various circuit patterns are described for electrically interconnecting the cells in series or parallel arrays, including ones that are useful for width-limited systems.

Other features and many attendant advantages of the invention are described or rendered obvious by the following detailed description which is to be considered together with the accompanying drawings wherein:

FIG. 6 is a fragmentary top view, partially broken away in section, of another embodiment of the present invention designed to interconnect solar cells in a parallel array and particularly adapted for width-limited systems;

FIG. 7 is a cross-sectional view on an enlarged scale taken along line 7—7 of FIG. 6; and FIG. 8 is a fragmentary top view, partially broken away in section, of another embodiment of the present invention designed to interconnect solar cells in a series array and particularly adapted for width-limited systems. Identical parts are identified in the several figures by the same numerals.

The present invention relates to simple and inexpensive solar cell support and interconnect assemblies which are particularly useful for interconnecting conventional flat solar cells, such as silicon solar cells. Flat solar cells, which are generally indicated both in solid and phantom lines throughout the drawings at 20, typically include metal electrodes (not shown) on the top and bottom surfaces (see U.S. Pats. Nos. 3,686,036, 3,589,946, 3,811,954 and 3,844,843). The electrodes are connected to P and N-type semiconductive materials, which in turn form a P-N junction. As well known, radiation of an appropriate wavelength passing through the grid-like top surface electrode and falling on this P-N junction serves as a source of external energy to generate hole-electron pairs in the body to produce a potential difference at the junction and thus across the electrodes. The electron and electron-pairs in the body thus, in effect, move across the junction in opposite directions to produce a source of electric current which is capable of driving an external circuit. By interconnecting electrodes of two or more solar cells, an array of solar cells can be provided which is useful for generating electric power. When the cells are connected in a series array, the voltage potential of the array is substantially the sum of the voltage potentials of the individual cells, while a parallel array provides a current source which is substantially the sum of the current sources provided by the individual cells. As well known in the art, the cell arrays can be interconnected in parallel and/or series to provide a matrix meeting predetermined power requirements.

Figure 1:
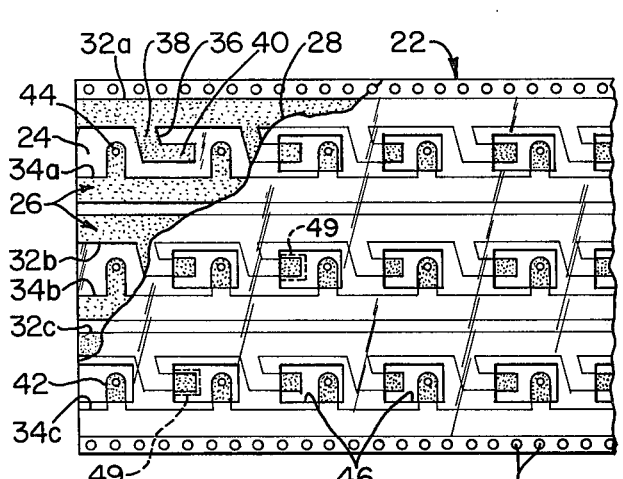
FIG. 1 is a fragmentary top view, partially broken away in section, illustrating the preferred embodiment of the present invention designed to interconnect a plurality of solar cells in a parrallel array.
Figure 2:
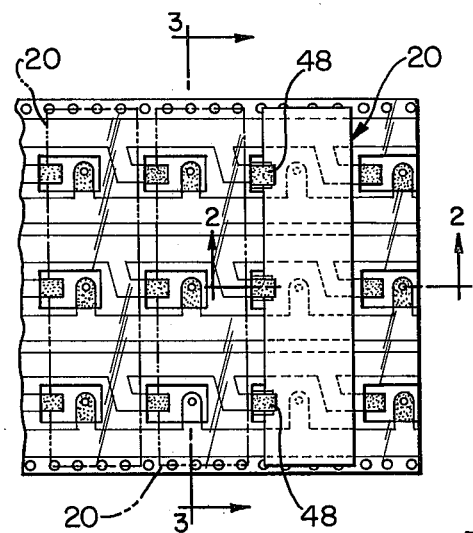
FIG. 2 is a longitudinal-sectional view on an enlarged scale taken along line 2–2 of FIG. 1.
Figure 2:
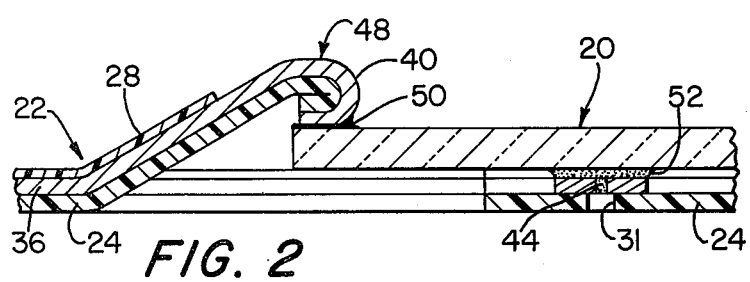
Figure 3:
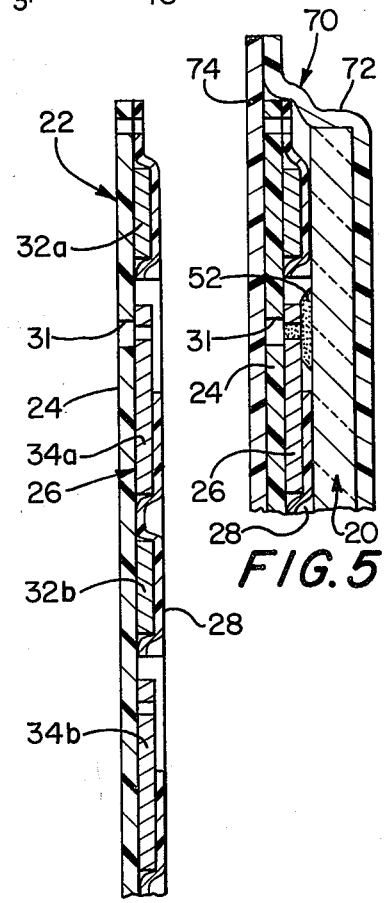
FIG. 3 is a cross-sectional view taken along line 3—3 of FIG. 1.

Referring to FIGS. 1–3, an assembly 22 is provided for mounting and interconnecting a plurality of elongate cells 20 so that they form an array wherein the long sides of the cells are parallel with one another and oriented transversely with respect to the longitudinal axis of the assembly 22. The assembly is designed so that it can be produced in continuous lengths and cut to any desired length for any number of cells. The assembly 22 is a laminate comprising a first protective or base sheet 24 of electrically-insulative material, an intermediate conductive metal layer identified generally by numeral 26 which is formed in a predetermined circuit pattern, and a protective cover or top sheet 28 of electrically-insulative material. Both of the sheets 24 and 28 are formed of a material which preferably is flexible but may be stiff, and which in any event has physical, chemical and mechanical properties which are substantially stable throughout the expected temperature range as well as the expected range of the radiation to which the assembly is to be exposed. Particularly suitable materials are any one of the various commercially-available polyimide or polyamide resins, although other materials, plain and fiber reinforced, can be employed such as polyvinyl chloride, epoxy, fluorocarbon or silicone resins, or a polyethylene terephthalate such as is manufactured by E. I. Du Pont De Nemours & Co., of Wilmington, Delaware, under the trademark "MYLAR". The base and top sheets 24 and 28 are preferably provided with sprocket holes 30 equally spaced from one another along each longitudinal edge and aligned so that the sheets can be easily registered with one another when they are secured together as will be evident hereinafter. Further the base sheet 24 is preferably but not necessarily, provided with a plurality of holes 31 for a purpose which will be explained hereinafter.

Base sheet 24 is preferably formed as a continuous sheet having layer 26 disposed thereon. The electrically-conductive material of layer 26 preferably is formed of copper or a copper alloy, although other conductive materials known to persons skilled in the art, e.g. silver, also may be used. The circuit pattern of layer 20 may be formed by depositing a conductive metal onto the base sheet through a suitable mask. Preferably, however, the circuit pattern is formed by depositing a film of conductive metal onto the base sheet 24 and then etching away portions of the film employing etching techniques well known in the art. More specifically, a layer of electrically-conductive material on the base sheet 24 is coated with a photoresist material which is sensitive to actinic radiation of a predetermined wavelength. A mask having a predetermined pattern of areas which are transmissive to the actinic radiation is placed over the electrically-conductive layer so that when actinic-radiation is transmitted through the mask, selected portions of the photoresist material are exposed. The exposed portions of photoresist are removed, leaving selected portions of the electrically-conductive material exposed. These exposed portions of the electrically-conductive materials are then chemically removed. The remaining photoresist material is then removed, exposing the remaining portion of the metal layer which has a predetermined circuit pattern. The predetermined pattern of the layer 26 shown in FIG. 1 is designed to connect the cells 20 in a parallel array. The pattern includes at least one bus line for connecting all of the upper surface electrodes of the cells and at least one bus line which is electrically-insulated from the first bus line for connecting all the bottom surface electrodes of the cells. Preferably, the pattern shown includes three identical spaced-apart bus lines 32a, 32b, and 32c for electrically connecting the upper suface electrodes of the cells and three identical spaced-apart bus lines 34a, 34b, 34c for electrically-connecting the bottom surface electrodes of the cells, whereby each electrode is joined at three places. This assures that the array will still be functional even though a particular connection may be interrupted or fail due to a poor solder joint, shock or other cause.

Lines 32a, 32b and 32c are disposed parallel to one another and to the longitudinal axis of the assembly 22. Each line 32 includes a plurality of L-shaped cell-connecting or terminal sections 36 corresponding to the maximum number of cells 20 which are to be connected together in the array. The terminal sections 36 are substantially identical to one another. Each terminal section includes an intermediate portion 38 which is connected at one end to the line and at its other end to a cell connecting portion 40. The latter portion extends generally in the longitudinal direction of the assembly. All of the terminal sections 36 of each line are preferably disposed to one side of the line and are aligned and equally spaced from one another. The space between adjacent terminal sections 36 is such that each can be connected to a corresponding one of the cells 20.

Lines 34a, 34b and 34c are also disposed substantially parallel to one another as well as to lines 32a, 32b and 32c. Preferably, line 34a is disposed between lines 32a and 32b, line 34b is disposed between lines 32b and 32c, and line 34c is disposed to one side of line 32c on the other side opposite line 34b. Each line 34 is provided with a plurality of transversely projecting cell-connecting or terminal sections 42. Each of the sections 42 extends between two sections 36 of the adjacent line 32 proximate to the connecting portion 40 of one of the ajdacent sections 36. Each section 42 preferably, but not necessarily, includes a hole 44, which is aligned with one of the holes 31 of base sheet 24, so that heat can be easily transferred from below the base sheet 24 to the area of the bottom surface electrode of each cell when connecting the cell to the assembly.

In order to protect the circuit pattern of conductive layer 26, the top sheet 28 substantially covers the layer 26 and is bonded to the exposed portions of the bottom sheet 24, i.e. sheets 24 and 26 are preferably bonded to one another wherever the layer 26 does not intervene. The sheet 28 is provided with a plurality of windows or apertures 46 which are arranged so that at least a portion of one terminal section 42 and a portion of the connecting portion 40 of te proximate terminal section 36 are exposed through each of the windows.

Incisions are made in the assembly to form connecting tabs which are identified generally by the numeral 48 in FIG. 2. Each tab 48 includes at least an exposed part of the connecting portion 40 of each of the sections 36. The incisions may be made in any one of several ways. Preferably, the portion of the bottom sheet 24 exposed through each window 46 is cut along the side of the edges of the cell-connecting portion 40 of the terminal section 36 which is exposed through the same window, as shown by the dotted line 49 in FIG. 1. Alternatively, the tabs can be formed by punching out parts of the bottom sheet 24 which are exposed through the windows 46 and surround the cell-connecting portions 40, leaving the portions 40 which are exposed through the window intact as well as insuring that those parts of the terminal sections 42 that are exposed through the windows remain undisturbed as well as adequately supported. The flexibility of the assembly allows each tab 48 to be lifted up and over one edge of a cell 20 and the end of the tab folded down under and back upon itself and a part of the terminal section 36 of the tab directly connected to the top surface electrode of the cell 20. The terminal section 36 can be electrically connected to the upper surface electrode in any manner known in the art, such as by soldering or by bonding the two together with an electrically-conductive cement 50.

Similarly, the part of each terminal portion 42 exposed through the window below the cell 20, is electrically-connected to the bottom surface electrode of the cell. Solder 52 can be placed between each terminal section 42 and the bottom surface electrode of the cell and heat applied through the hole 31 of bottom sheet 24 and the aligned hole 44 of terminal portion 42 so as to melt the solder and form a soldered connection or connected in another acceptable manner.

Figure 4:
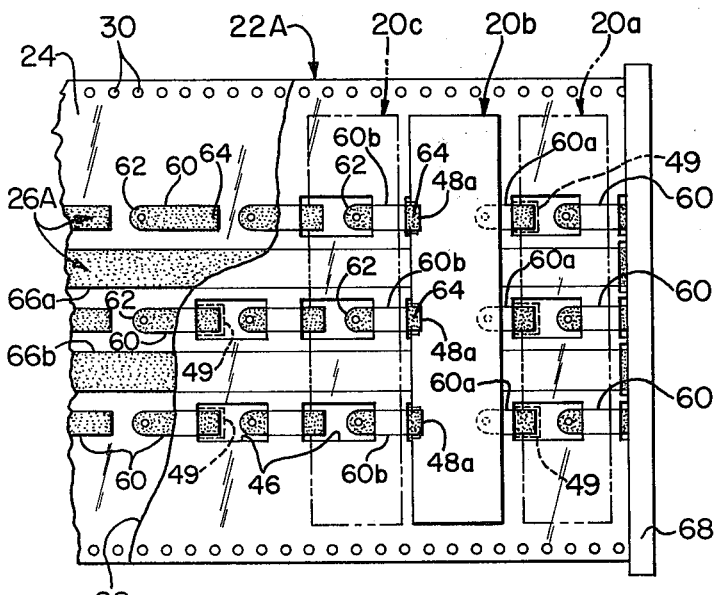
FIG. 4 is a fragmentary top view, partially broken away in section, illustrating the preferred embodiment of the present invention designed to interconnect a plurality of solar cells in a series array.

Referring to FIG. 4, the support assembly 22A is constructed in the same manner as the embodiment described in FIGS. 1-3, except that the circuit pattern of conductive layer 26a is designed to interconnect the cells 20 in a series array. More particularly, the predetermined pattern of layer 26a enables the top surface electrode of one cell to be connected to the bottom surface electrode of an adjacent cell. Generally, the pattern for providing a series connected array includes at least one series of elongate cell-connecting strips 60 which are aligned with one another and extend parallel to the longitudinal axis of the support assembly 22a. The opposite ends 62 and 64 of strips 60 form terminal portions which can be attached respectively to the bottom surface electrode of one cell and the top surface electrode of the next adjacent cell. The pattern of layer 26a also includes at least one bus line 66 whereby both positive and negative output terminal connections may be achieved at the same end of the support assembly. Preferably, as shown in FIG. 4, the pattern of layer 26A is arranged to provide three identical series of strips 60 and two identical bus lines 66a and 66b, so that multiple connections can be made to each electrode to insure good connections between cells. The strips of each series are disposed parallel to the strips of the other two series, as well as the two bus lines 66a and 66b. Each of the bus lines is positioned between two of the three series of strips 60. Sheet 28 is secured to the sheet 24 and layer 26a so that each window 46 preferably exposes an end portion 62 of one strip and an end portion 64 of the next adjacent strip of the same series.

Incisions 49 are made in the assembly 22a of FIG. 4, in a manner similar to the assembly 22 of FIGS. 1-3, in order to form connecting tabs 48a similar to tabs 48. Each tab 48a includes at least a part of the exposed terminal portion 64. The cells 20 are mounted on the assembly in a manner similar to that by which the cells are mounted in the embodiment of FIG. 1 as previously described. More specifically, the bottom surface electrode of each cell is attached to a part of the terminal portion 62 of each of the corresponding strips 60 which are exposed through windows 46. Similarly, the part of the exposed terminal portion 64 provided on each tab is extended above and over the edge of an adjacent cell, and folded and connected to the top surface electrode in the manner previously described for the tabs 48 of the embodiment of FIGS. 1-3.

Thus, as shown in FIG. 4, the cells are connected in series whereby the top surface electrode of the end cell 20a is connected to the bottom surface electrode of cell 20b by strips 60a, the top surface electrode of cell 20b is connected to the bottom surface electrode of cell 20c by the strips 60b, etc. The two exterior circuit connections can be provided at one end of the assembly by interconnecting the bottom surface electrode of the end cell 20a to bus lines 66 by any suitable means, e.g. by removing portions of top sheet 28 at one end and applying a conductive metal edge connector 68 which connects lines 66 to the three strips 60a, which in turn are connected to the bottom surface electrode of the end cell 20a. The edge connector 68 preferably is of U-shaped cross-section and is crimped onto the assembly so as to make firm contact with lines 66 and strips 66a. The connections to the exterior circuit are made at the end of the assembly remote from strip connector 68, with bus lines 66 forming one terminal and the strips 60 forming the other terminal.

Figure 5:
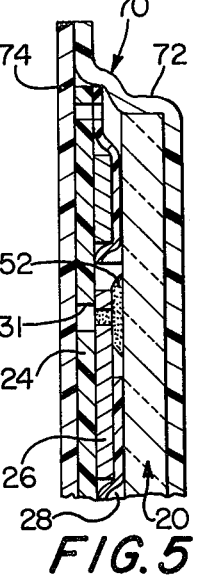
FIG. 5 illustrates a fragmentary cross-sectional view on an enlarged scale of an assembly constituting a modification of the present invention.

The solar cells of the assemblies 22 and 22a described in FIGS. 1—4 are disposed and connected so that the electrically-conductive material of layer 26 is substantially protected from oxidation, corrosion and short-circuiting. However, since some portions of the layer are exposed, particularly at the connecting points of the upper surface electrodes of the cells and since it may be desirable to protect the cells from certain environmental conditions, the solar cell assemblies of the present invention can be further protected by hermetically sealing the solar cell assembly in a protective envelope such as envelope 70 shown in FIG. 5. Envelope 70 is evacuated or filled with an inert gas and sealed along its edges. The envelope 70 preferably includes two sheets 72 and 74 of material of which at least the top sheet 72 covering the front or radiation-receiving surfaces of cells 20, is transmissive to wavelengths of radiation to which the cells are sensitive. For example, where cells 20 are of the silicon type and sensitive to ultraviolet portions of the electromagnetic spectrum, top sheet 72 (and also sheet 74) can be made of any one of various types of plastic materials which are capable of passing solar light, e.g. a polyethylene terephthalate resin manufactured under the trademark MYLAR by E. I. du Pont de Nemours & Co., Inc., of Delaware.

The cells 20 shown in FIGS. 1–4 are arranged so that their longitudinal axes are transversely oriented with respect to the longitudinal axis of assembly 22 or 22a, whereby a minimum length of laminate material is necessary for each solar cell mounted thereon. However, in some applications such as where the cells are to be positioned at the foci points of solar concentrators, it is advantageous to minimize the width of the solar cell assembly so as to concentrate as much solar radiation as possible on the upper cell surface. Thus the solar cell assemblies of FIGS. 6–8 are made substantially the same as the laminate assemblies as previously described except that the width of the assembly is reduced, the cells are oriented so that their longitudinal dimension is substantially parallel to the longitudinal dimension of the laminate support assembly, and the circuit patterns of conductive layer 26 are modified to interconnect the cells in a parallel or series array.

Referring now to the embodiment of FIGS. 6 and 7 wherein the cells 20 are connected in a parallel array, the circuit pattern of layer 26b is arranged to provide two parallel, mutually spaced bus lines 80 and 82 which extend the length of the assembly. Bus line 80 includes spaced apart apertures 84, while bus line 82 includes terminal sections 86, which extend away from the bus line 80 toward one edge of the assembly. The upper sheet 28b is provided with a plurality of windows 46b for exposing selected cell-connecting sections 80a of bus line 80, and a plurality of windows 46c for exposing at least a part of each of the terminal sections 86. Incisions are made as at 89 in FIG. 6 in order to form tabs 88 (FIG. 7), with each tab including at least an exposed part of a terminal section 86 and a portion of the top sheet 28b. The cells 20 are positioned on the assembly and each of the cell-connecting sections 80a of the bus line 80 exposed through the windows 46b is attached to the bottom surface electrode of the adjacent cell. The tabs 88 are wrapped around the edge of the cell so that the exposed terminal sections 86 can be connected to the top surface electrodes of the cells by any suitable means such as solder or electrically-conductive cement 50, or any other type of electrical connection known in the art. The portion of sheet 28b on tab 86 prevents the upper and lower surface electrodes of the cell from being shorted together. The bottom surface electrodes of the cells are connected to bus line 80 by means of solder or a conductive cement 52. Apertures 84 and aligned holes 31 in the bottom sheet 24 may be used to apply heat to melt the solder provided to connect the bottom surface electrodes of the cells to bus line 80. The circuit pattern of layer 26b thus interconnects the cells in paralel.

Referring to FIG. 8, the circuit pattern of the conductive layer is designed to interconnect the solar cells in a series array. Thus, in this case the conductive layer 26c is arranged so as to provide a plurality of strips 92 with each strip including a first longitudinally-extending cell-connecting section 94 for connecting the strip to the bottom surface electrode of one of the cells, a second offset longitudinally-extending cell-connecting section 96 for connecting the strip to the upper surface electrode of the next adjacent cell, and a third transversely extending section 98 which connects adjacent ends of sections 94 and 96. The section 94 includes at least one, and preferably a plurality of spaced-apart holes 100, while section 96 includes terminal portions 102 which preferably extend transversely away from the sections 94 toward one edge of the assembly. The top sheet 28c of electrically-insulative material is provided with a plurality of windows 46d for exposing selected portions of the section 94 and a plurality of spaced-apart windows 46c for exposing at least a part of each of the terminal portions 102. Incisions 103 are made in the assembly in the same manner as previously described so as to form tabs 104, each of which includes at least an exposed part of a terminal portion 102 and a portion of the sheet 28c. The cells 20 are positioned on the assembly in a spaced-apart side-by-side relationship so that their longitudinal dimension is substantially parallel to the longitudinal dimension of the assembly, wherein each cell covers one section 94 of one strip and has one edge adjacent the tabs 104 of the next adjacent strip. The portions of section 94 exposed through the windows 46 are electrically-connected to the bottom surface electrode of the overlying cell, while the tabs 102 of the adjacent section 96 of the next strip 92 are wrapped around the edge of the same cell so that the exposed terminal portions 102 can be connected to the top surface electrode of the cell, in a manner as previously described. The bottom surface electrodes of each cell are thus connected to the upper surface electrode of the next adjacent cell to provide a series array. In order to connect the bottom surface electrode of the end cell of the array to the opposite end of the assembly the latter may but need not include a bus line 106, which extends parallel to and is spaced from the sections 94 and 96 of the strips 92. Terminal connections can be provided at one end of the assembly in a similar manner as previously described with respect to the embodiment of FIG. 4 by removing selected portions of top layer 28 c to expose selected portions of bus line 104 and strip section 94 beyond the end cell at one end, and connecting the exposed portions of bus line 104 and strip section 94 by any suitable means such as a slip edge connector so that the top surface electrode of the end cell and the bus line can be suitably connected. Thus, at the opposite end of the assembly, the bus line 104 and the last strip section 92 serve as connecting terminals for connecting the several series connected solar cells to an exterior circuit.

The mounting and interconnecting assembly thus described has several advantages over the prior art. The use of the top and bottom sheets 24 and 28 of electrically-insulative material protects the circuit patterns of layer 26 from oxidizing, corroding and short-circuiting. The assembly is not only flexible, thus allowing it to conform to various surfaces to which it can be attached, but has a relatively greater resistance to thermal shocks and vibrations than is provided by some of the prior art assemblies. The assembly provides reliable electrical connection between solar cells of an array. Further, the assembly is easily adapted to be used in width-limited systems, such as solar concentrators. Finally, the assemblies constructed in accordance with the principles of the present invention are relatively inexpensive to manufacture, require a minimum of labor to make, have a rugged construction and can be produced in modular form.

Since certain changes may be made in the above products, without departing from the scope of the invention herein involved, it is intended that all matter contained in the above description or shown in the accompanying drawing shall be interpreted in an illustrative and not in a limiting sense.

What is claimed is:

1. A solar cell assembly comprising:
   a plurality of solar cells, each having a top surface electrode and a bottom surface electrode; and
   means for interconnecting said cells comprising a laminate having a first sheet of electrically-insulative material, a layer of electrically-conductive material disposed on said first sheet in a predetermined geometric pattern, and a second sheet of electrically-insulative material having a plurality of openings and being disposed over said layer so as to expose selected first and second portions of said layer through said openings;
   at least one of said first portions of said layer being electrically connected through one of said openings to the bottom surrface electrode of one of said cells;
   said laminate also being provided with incisions so as to form a plurality of bendable tabs with each of said tabs including an exposed part of one of said second portions of said layer, each of said tabs being bent so that the exposed part of the second portion of said layer overlies at least a portion of the top surface electrode of each one of said cells, said overlying part of said layer being electrically connected to the top surface electrode which it overlies; and
   said first portions being electrically insulated from said second portions.

2. An assembly in accordance with claim 1, wherein said predetermined geometric pattern is arranged so that the layer of conductive material connects said cells in a parallel array.

3. An assembly in accordance with claim 2, wherein said predetermined pattern is arranged so that said layer includes at least six bus lines, three of said lines connecting said top surface electrodes of said cells together and the other three of said lines connecting the bottom surface electrodes of said cells together.

4. An assembly in accordance with claim 1, wherein said predetermined geometric pattern is arranged so that said layer includes at least two bus lines, a first one of said bus lines connecting the top surface electrodes of said cells and a second one of said lines connecting the bottom surface electrodes of said cells.

5. An assembly in accordance with claim 4, wherein said first bus line includes a plurality of terminal sections, at least a part of each of said terminal sections forming part of one of said tabs.

6. An assembly in accordance with claim 5, wherein said second line includes a second plurality of terminal portions, and each of said first portions is part of one of said terminal sections.

7. An assembly in accordance with claim 6, wherein said first sheet of electrically-insulative material includes a plurality of holes and said second-mentioned terminal sections are each provided with an aperture aligned with one of said holes so that heat may be transferred through said first sheet and said layer to the bottom surface electrode of each of said cells.

8. An assembly in accordance with claim 1, wherein each of said tabs is wrapped around an edge of one of said cells and connected to the top surface electrode of said one cell.

9. An assembly in accordance with claim 1, wherein said predetermined pattern is arranged so that said layer connects said cells in a series array.

10. An assembly in accordance with claim 1, wherein said predetermined pattern is arranged so that said layer includes a plurality of strips, each of said strips having a portion connected to the bottom surface electrode of one cell and another portion connected to the upper surface electrode of an adjacent cell.

11. An assembly in accordance with claim 10 wherein said strips are aligned and disposed substantially parallel with one another.

12. An assembly in accordance with claim 10 wherein said strips are disposed in three groups, with the strips of each group being aligned with one another and disposed substantially parallel the strips of the other group.

13. An assembly in accordance with claim 10, wherein each of said strips includes a first section and a second section, said first and second sections being offset and connected together by an intermediate section.

14. An assembly in accordance with claim 1, further including a light transmissive envelope, said cells and said laminate being hermetically sealed in said envelope.

15. In a solar cell assembly of the type comprising at least two solar cells, each having top and bottom surface electrodes, and means for interconnecting said cells comprising a laminate having a first sheet of electrically-insulative material and a layer of electrically-conductive material disposed on said first sheet in a predetermined geometric pattern, said layer comprising first and second portions electrically-insulated from one another, said first portions being electrically-connected to the bottom surface electrode of each one of said cells, said laminate being provided with incisions so as to form a plurality of bendable tabs with each of said tabs including said second portions wherein said second portions are electrically-connected to said top surface electrode of each one of said cells, the improvement comprising:
   a second sheet of electrically-insulative material having a plurality of openings and being disposed over said layer so as to expose said first and second portions of said layer through said openings.

* * * * *